(12) United States Patent
Jeong

(10) Patent No.: US 9,065,019 B2
(45) Date of Patent: Jun. 23, 2015

(54) LIGHT EMITTING DEVICE

(71) Applicant: LG INNOTEK CO., LTD., Seoul (KR)

(72) Inventor: Hwan Hee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/147,754

(22) Filed: Jan. 6, 2014

(65) Prior Publication Data

US 2014/0191267 A1   Jul. 10, 2014

(30) Foreign Application Priority Data

Jan. 10, 2013 (KR) .................. 10-2013-0002901
Jan. 10, 2013 (KR) .................. 10-2013-0002962

(51) Int. Cl.
*H01L 33/40* (2010.01)
*H01L 33/36* (2010.01)
*H01L 33/38* (2010.01)

(52) U.S. Cl.
CPC .............. *H01L 33/405* (2013.01); *H01L 33/36* (2013.01); *H01L 33/382* (2013.01); *H01L 33/387* (2013.01)

(58) Field of Classification Search
CPC ..... H01L 33/382; H01L 33/405; H01L 33/36; H01L 33/387
USPC ................................. 257/98, 99, 79
See application file for complete search history.

(56) References Cited

U.S. PATENT DOCUMENTS

| 8,039,860 B2 * | 10/2011 | Moon et al. ............... 257/98 |
| 2010/0171135 A1 | 7/2010 | Engl et al. ............... 257/98 |
| 2011/0012164 A1 | 1/2011 | Kim ................... 257/99 |
| 2011/0193123 A1 * | 8/2011 | Moon et al. ............... 257/98 |
| 2012/0049236 A1 | 3/2012 | Kamiya et al. ............ 257/99 |

FOREIGN PATENT DOCUMENTS

| EP | 2 365 544 A1 | 9/2011 |
| EP | 2 506 315 A2 | 10/2012 |

OTHER PUBLICATIONS

European Search Report dated Apr. 15, 2014 issued in Application No. 13 195 535.3.

* cited by examiner

*Primary Examiner* — Nikolay Yushin
(74) *Attorney, Agent, or Firm* — KED & Associates LLP

(57) ABSTRACT

A light emitting device according to the embodiment includes a light emitting structure including a first conductive semiconductor layer, an active layer disposed under the first conductive semiconductor layer, and a second conductive semiconductor layer disposed under the active layer. A first electrode is disposed under the light emitting structure and is electrically connected to the first conductive semiconductor layer, and a second electrode is disposed under the light emitting structure and is electrically connected to the second conductive semiconductor layer. A first contact portion is disposed through the light emitting structure and includes a first region electrically connected to the first electrode and a second region making contact with a top surface of the first conductive semiconductor layer.

20 Claims, 18 Drawing Sheets

LIGHT EMITTING DEVICE

CROSS-REFERENCE TO RELATED APPLICATIONS

The present application claims priority under 35 U.S.C. 119 to Korean Patent Application No. 10-2013-0002901, filed on Jan. 10, 2013, and Korean Patent Application No. 10-2013-0002962, filed on Jan. 10, 2013, which are hereby incorporated by reference in their entirety.

BACKGROUND

1. Field

The embodiment relates to a light emitting device, a light emitting device package, and a light unit.

2. Background

A light emitting diode (LED) has been extensively used as one of light emitting devices. The LED converts electrical signals into the form of light such as infrared light, visible light and ultra-violet light by using the characteristic of a compound semiconductor.

As the light efficiency of the light emitting device is increased, the light emitting device has been used in various fields such as display apparatuses and lighting appliances.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

Hereinafter, a light emitting device, a light emitting device package, a light unit, and a method for fabricating the light emitting device according to the embodiments will be described in detail with reference to accompanying drawings.

Figure 1:
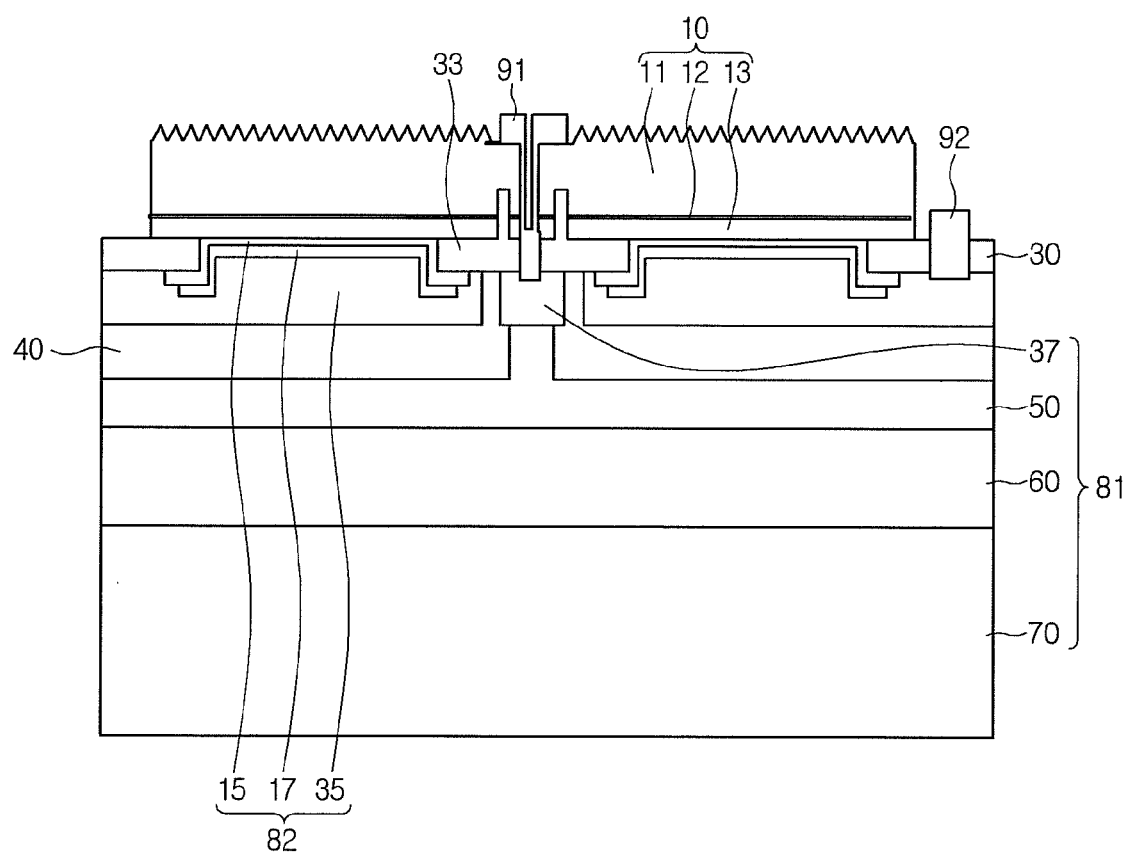
FIG. 1 is a view showing a light emitting device according to the embodiment.
Figure 2:
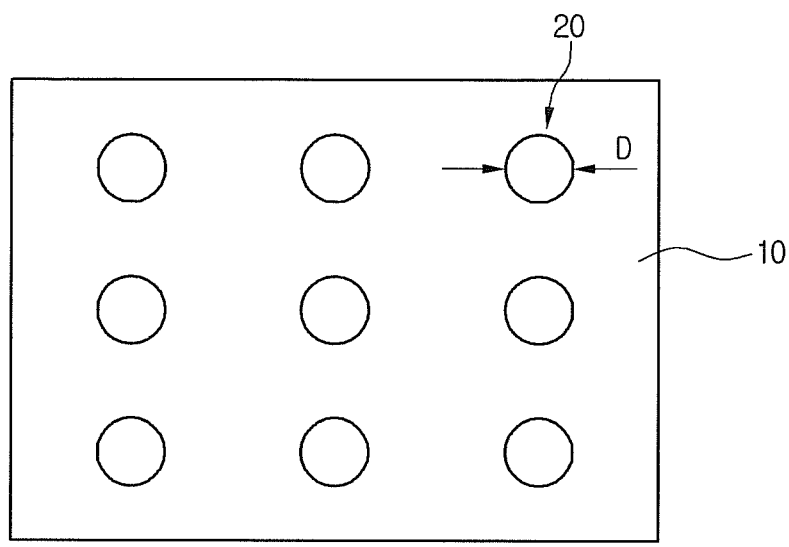
FIG. 2 is a view showing an example of a through hole formed in a light emitting structure of a light emitting device shown in FIG. 1.

FIG. 1 is a view showing a light emitting device according to the embodiment and FIG. 2 is a view showing an example of a through hole formed in a light emitting structure of the light emitting device shown in FIG. 1.

As shown in FIGS. 1 and 2, the light emitting device according to the embodiment may include a light emitting structure 10, a first electrode 81, a second electrode 82 and a first contact portion 91.

The light emitting structure 10 may include a first conductive semiconductor layer 11, an active layer 12, and a second conductive semiconductor layer 13. The active layer 12 may be interposed between the first conductive semiconductor layer 11 and the second conductive semiconductor layer 13. The active layer 12 may be provided under the first conductive semiconductor layer 11, and the second conductive semiconductor layer 13 may be provided under the active layer 12.

The first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor layer. The first conductive semiconductor layer 11 may be realized by using a compound semiconductor. The first conductive semiconductor layer 11 may be realized by using a group II-VI compound semiconductor, or a group III-V compound semiconductor.

For example, the first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may include a P-type semiconductor layer. The second conductive semiconductor layer 13 may be realized by using a compound semiconductor. For example, the second conductive semiconductor layer 13 may be realized by using a group II-VI compound semiconductor, or a group II-V compound semiconductor.

For example, the second conductive semiconductor layer 13 may be realized by using a semiconductor material having a compositional formula of $In_xAl_yGa_{1-x-y}N$ ($0 \leq x \leq 1$, $0 \leq x+y \leq 1$). For example, the second conductive semiconductor layer 13 may include one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided under the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the light emitting structure 10 may have various structures, and the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

The light emitting device according to the embodiment may include a reflective layer 17. The reflective layer may be electrically connected to the second conductive semiconductor layer 13. The reflective layer may be disposed under the light emitting structure 10. The reflective layer may be disposed under the second conductive semiconductor layer 13. The reflective layer 17 may reflect light incident thereto from the light emitting structure 10 to increase the quantity of light extracted to an outside.

The light emitting device according to the embodiment may include an ohmic contact layer 15 interposed between the reflective layer 17 and the second conductive semiconductor layer 13. The ohmic contact layer 15 may make contact with the second conductive semiconductor layer 13. The ohmic contact layer 15 may make ohmic contact with the light emitting structure 10. The ohmic contact layer 15 may include a region that makes ohmic-contact with the light emitting structure 10. The ohmic contact layer 15 may include a region that makes ohmic-contact with the second conductive semiconductor layer 13.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may include a material having high reflectance. For example, the reflective layer 17 may include metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately formed, and may include Ni/Ag/Ni or a Tl layer, and a Pt layer. In addition, the ohmic contact layer 15 may be provided under the reflective layer 17, and at least a portion of the ohmic contact layer 15 may make ohmic-contact with the light emitting structure 10 through the reflective layer 17.

The light emitting device according to the embodiment may include a first metal layer 35 provided under the reflective layer 17. The first metal layer 35 may include at least one of Au, Cu, Ni, Ti, Ti—W, Cr, W, Pt, V, Fe, and Mo.

According to the embodiment, the second electrode 82 may include at least one of the reflective layer 17, the ohmic contact layer 15, and the first metal layer 35. For example, the second electrode 82 may include all of the reflective layer 17, the first metal layer 35, and the ohmic contact layer 15, or may include one or two selected from the of the reflective layer 17, the first metal layer 35, and the ohmic contact layer 15.

The second electrode 82 according to the embodiment may be disposed under the light emitting structure 10. The second electrode 82 may be electrically connected to the second conductive semiconductor layer 13.

The light emitting device according to the embodiment may include a channel layer 30 provided around a region underneath the light emitting structure 10. One end of the channel layer 30 may be provided under the second conductive semiconductor layer 13. The one end of the channel layer 30 may make contact with a bottom surface of the second conductive semiconductor layer 13. The one end of the channel layer 30 may be interposed between the second conductive semiconductor layer 13 and the reflective layer 17. The one end of the channel layer 30 may be interposed between the second conductive semiconductor layer 13 and the ohmic contact layer 15.

The channel layer 30 may include an insulating material. For example, the channel layer 30 may be realized by using oxide or nitride. For example, the channel layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the light emitting structure 10 later. In addition, the channel layer 30 may prevent the electrical characteristic of the light emitting device from being degraded caused by the isolation process.

The light emitting device according to the embodiment may include a first insulating layer 33. For example, the first insulating layer 33 may be realized by using oxide or nitride. For example, the first insulating layer 33 may include at least one selected from the group consisting of $SiO_2$, $Si_xO_y$, $Si_3N_4$, $Si_xN_y$, $SiO_xN_y$, $Al_2O_3$, $TiO_2$, and AlN. The first insulating layer 33 may be formed by using a material constituting the channel layer 30. In addition, the first insulating layer 33 and the channel layer 30 may be formed by mutually different materials.

The light emitting device according to the embodiment may include a second metal layer 37 provided under the first insulating layer 33. The second metal layer 37 may include at least one of Cu, Ni, Ti, Ti—W, Cr, W, Pt, V, Fe, and Mo. The second metal layer 37 may be formed by using a material constituting the first metal layer 35. In addition, the first and second metal layers 35 and 37 may be formed by using mutually different materials.

A second insulating layer 40 may be disposed between the first and second metal layers 35 and 37. The second insulating layer 40 may be formed by using oxide or nitride. For example, the second insulating layer 40 may include at least one selected from the group consisting of SiO2, SixOy, Si3N4, SixNy, SiOxNy, Al2O3, TiO2, and AlN. The second insulating layer 40 may be disposed under the first metal layer 35. The second insulating layer 40 may be disposed under the first insulating layer 33.

A third metal layer 50 may be disposed under the second metal layer 37. The third metal layer 50 may be electrically connected to the second metal layer 37. A top surface of the third metal layer 50 may make contact with a bottoms surface of the second metal layer 37. The third metal layer 50 may be disposed under the second insulating layer 40.

The third metal layer 50 may include at least one of Cu, Ni, Ti, Ti—W, Cr, W, Pt, V, Fe, and Mo. The third metal layer 50 may serve as a diffusion barrier layer. A bonding layer 60 and the conductive support member 70 may be provided under the third metal layer 50.

The third metal layer 50 may prevent a material included in the bonding layer 60 from being diffused to the reflective layer 17 in the process of providing the bonding layer 60. The third metal layer 50 may prevent a material, such as Sn, included in the bonding layer 60 from exerting an influence on the reflective layer 17.

The bonding layer 60 includes barrier metal or bonding metal. For example, the bonding layer 60 may include at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, the first electrode 81 may include at least one of the second metal layer 35, the third metal layer 50, the bonding layer 60 and the conductive support member 70. The first electrode 81 may include all of the second metal layer 35, the third metal layer 50, the bonding layer 60 and the conductive support member 70. In addition, the first electrode 81 may selectively include two or three of the second metal layer 35, the third metal layer 50, the bonding layer 60 and the conductive support member 70.

The first electrode 81 may be disposed under the light emitting structure 10. The first electrode 81 may be electrically connected to the first conductive semiconductor layer. A bottom surface of the first electrode 81 may be located lower than a bottom surface of the second electrode 82.

The light emitting device according to the embodiment may include the first conduct portion 91. The first conduct portion 91 may be disposed through the light emitting structure 10. The first conduct portion 91 may be disposed through the first conductive semiconductor layer 11, the active layer 12 and the second conductive semiconductor layer 13.

For example, as shown in FIG. 2, a plurality of through holes 20 may be formed in the light emitting structure 10. The first contact portion 91 may be disposed along the through holes 20 of the light emitting structure 10. A first region of the first contact portion 91 may be electrically connected to the first electrode 81 and a second region of the first contact portion 91 may make contact with a top surface of the first conductive semiconductor layer 11.

For instance, the first region of the first contact portion 91 may make contact with the second metal layer 37. The first region of the first contact portion 91 may make contact with the top surface of the second metal layer 37. For example, when the light emitting structure 10 is grown into a GaN semiconductor layer, the first contact portion 91 may make contact with an n face of the first conductive semiconductor layer 11.

Although only one first contact portion 91 is illustrated in the light emitting device shown in FIG. 1, the light emitting structure 10 according to the embodiment may be formed with a plurality of through holes 20 as shown in FIG. 2 and the first contact portion 91 may be formed in each through hole 20. Meanwhile, the through hole 20 may have a width or a diameter D in the range of 5 μm to 200 μm If the through hole 20 has a width or a diameter less than 5 μm the process to form the first contact portion 91 may be difficult. In addition, if the through hole 20 has a width or a diameter greater 200 μm the light emitting area of the light emitting structure 10 is reduced so that the light extraction efficiency may be degraded. The first contact portion 91 disposed in the through hole 20 may also have a width or a diameter in the range of 5 μm to 200 μm The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

For example, the first contact portions 91 disposed on the top surface of the first conductive semiconductor layer 11 may extend from the peripheral portion of the through hole 20 in the range of 5 μm to 50 μm The first insulating layer 33 disposed under the through hole 20 may extend from the peripheral portion of the through hole 20 in the range of 5 μm to 70 μm According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

A portion of the first insulating layer 33 may be disposed in the light emitting structure 10. A portion of the first insulating layer 33 may be disposed around the first contact portion 91. For example, the portion of the first insulating layer 33 surrounds the first contact portion 91 so that the internal region surrounded by the first insulating layer 33 may be insulated from the external region. The portion of the first insulating layer 33 may be disposed through the second conductive semiconductor layer 13 and the active layer 12. The portion of the first insulating layer 33 may be disposed through the active layer 12 to the extent than the portion has the length equal to or less than 1000 nm in the depth direction.

The portion of the first insulating layer 33, which is disposed through the active layer 12, may have a depth sufficient for insulating the active layer 12 formed inside the first insulating layer 33 from the active layer 12 formed outside the first insulating layer 33.

In addition, the light emitting device according to the embodiment may include a second contact portion 92. The second contact portion 92 may be spaced apart from the light emitting structure 10. The second contact portion 92 may be electrically connected to the second electrode 82. The second contact portion 92 may be electrically connected to the second electrode 82 by passing through the channel layer 30. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials. A top surface of the first contact portion 91 may be located higher than a top surface of the second contact portion 92.

A roughness may be formed on the top surface of the first conductive semiconductor layer 11. Accordingly, the quantity of light extracted upward at the region where the roughness is formed can be increased.

The light emitting device according to the embodiment may include the second insulating layer 40 interposed between the first metal layer 35 and the third metal layer 50. The second insulating layer 40 may insulate the first metal layer 35 from the third metal layer 50. The second insulating layer 40 may insulate the first metal layer 35 from the conductive support member 70. For example, the second insulating layer 40 may be realized by using oxide or nitride. For example, the second insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN.

A portion of the second insulating layer 40 may surround a peripheral portion of the second metal layer 37. An upper portion of the second insulating layer 40 may make contact with the bottom surface of the first insulating layer 33.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Hereinafter, a method of fabricating the light emitting device according to the embodiment will be described with reference to FIGS. 3 to 6.

Figure 3:
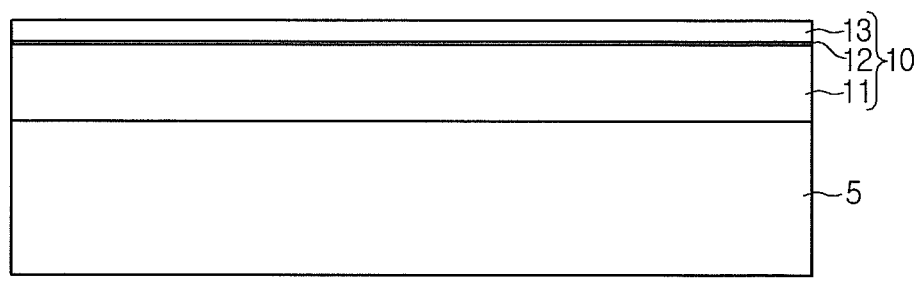
FIGS. 3 to 6 are sectional views showing a method of fabricating a light emitting device according to the embodiment.

According to the method of fabricating the light emitting device of the embodiment, as shown in FIG. 3, the first conductive semiconductor layer 11, the active layer 12, and the second conductive semiconductor layer 13 may be formed on a substrate 5. The first conductive semiconductor layer 11, the active layer 12, and the second conductive semiconductor layer 13 may be defined as the light emitting structure 10.

For example, the substrate 5 may include at least one of a sapphire substrate ($Al_2O_3$), SiC, GaAs, GaN, ZnO, Si, GaP, InP, and Ge, but the embodiment is not limited thereto. A buffer layer may be interposed between the first conductive semiconductor layer 11 and the substrate 5.

The first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor. The first conductive semiconductor layer 11 may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may include one selected from the group consisting of InAlGaN, GaN, AlGaN, AlInN, InGaN, AlN, and InN, and may be doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may be realized by using a P type semiconductor. The second conductive semiconductor layer 13 may be realized by using a semiconductor material having a compositional formula of InxAlyGa1-x-yN (0≤x≤1, 0≤y≤1, 0≤x+y≤1). For example, the second conductive semiconductor layer 13 may include one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided on the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform doping concentration. In other words, the light emitting structure 10 may have various structures, and the embodiment is not limited thereto.

In addition, the first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

Figure 4:
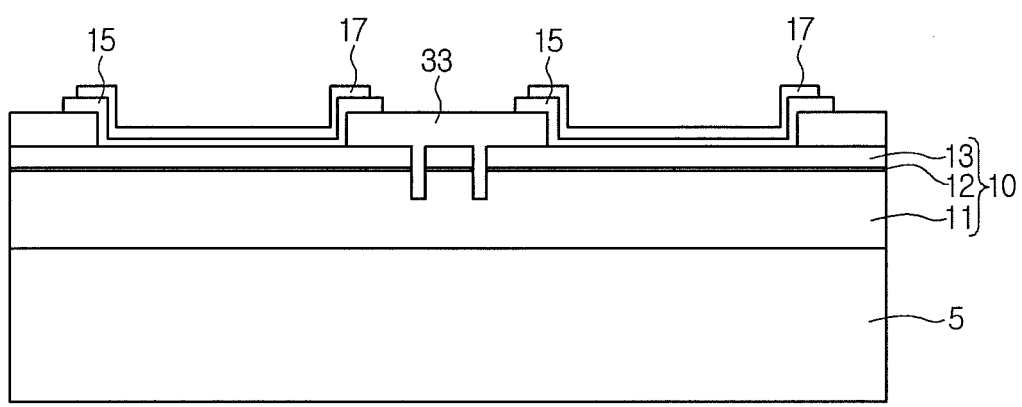

Next, as shown in FIG. 4, a portion of the first conductive semiconductor layer 11 may be exposed by performing an etching scheme for the light emitting structure 10. In this case, the etching may include a wet etching scheme or a dry etching scheme. The etched region may be disposed through the second conductive semiconductor layer 13 and the active layer 12.

In addition, as shown in FIG. 4, the first insulating layer 33 is formed on the exposed first conductive semiconductor layer 11. Further, the channel layer 30 is formed on the light emitting structure 10. The first insulating layer 33 and the channel layer 30 may be formed by using the same material or mutually different materials.

The channel layer 30 and the first insulating layer 33 may be formed by using insulating materials. For example, the channel layer 30 and the first insulating layer 33 may be formed by using oxide or nitride. For instance, the channel layer 30 and the first insulating layer 33 may be formed by using at least one selected from the group consisting of SiO2, SixOy, Si3N4, SixNy, SiOxNy, Al2O3, TiO2, and AlN.

Then, as shown in FIG. 4, the light emitting structure 10 may be provided therein with the ohmic contact layer 15 and the reflective layer 17.

The ohmic contact layer 15 may be interposed between the reflective layer 17 and the second conductive semiconductor layer 13. The ohmic contact layer 15 may make contact with the second conductive semiconductor layer 13.

The ohmic contact layer 15 may make ohmic-contact with the light emitting structure 10. The reflective layer 17 may be electrically connected to the second conductive semiconductor layer 13. The ohmic contact layer 15 may include an ohmic-contact region that makes ohmic-contact with the light emitting structure 10.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may include a material having high reflectance. For example, the reflective layer 17 may include metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately formed, and may include Ni/Ag/Ni or a Tl layer, and a Pt layer. In addition, the ohmic contact layer 15 may be provided under the reflective layer 17, and at least a portion of the ohmic contact layer 15 may make ohmic-contact with the light emitting structure 10 through the reflective layer 17.

Figure 5:
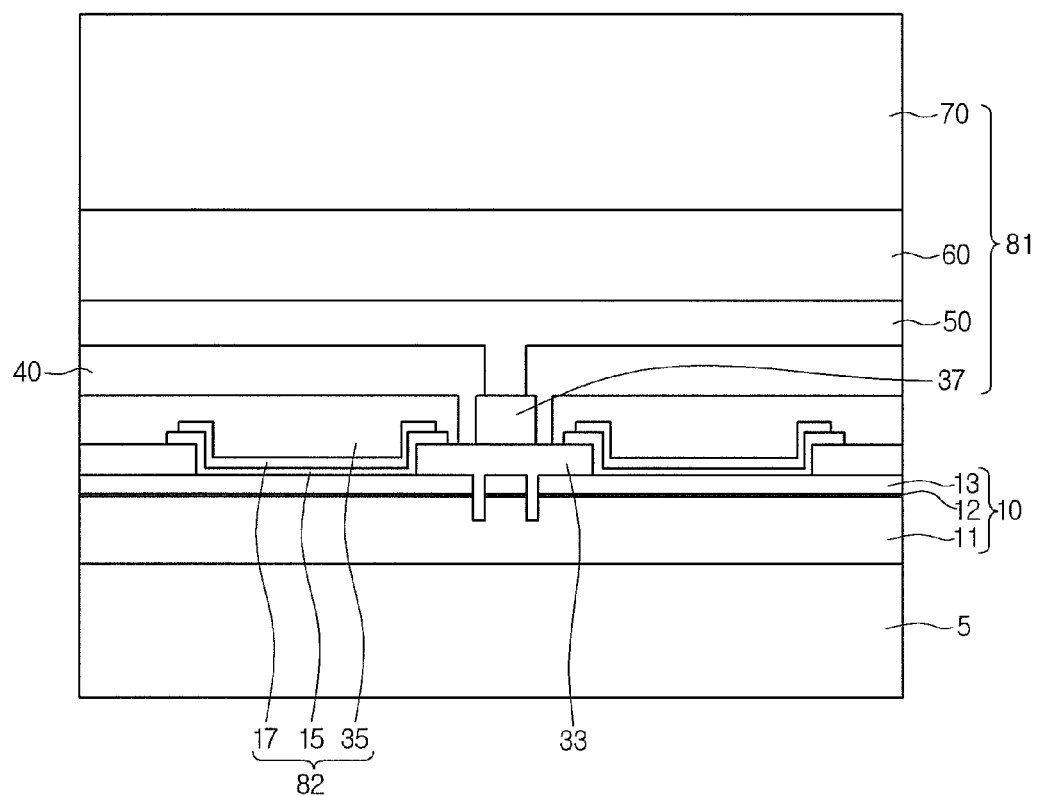

Thereafter, as shown in FIG. 5, the first metal layer 35, the second metal layer 37, the second insulating layer 40, the third metal layer 50, the bonding layer 60, and the conductive support member 70 may be formed on the reflective layer 17.

The first metal layer 35 may include at least one selected from the group consisting of Au, Cu, Ni, Ti, Ti—W, Cr, W, Pt, V, Fe, and Mo. According to the embodiment, the second electrode 82 may include at least one of the reflective layer 17, the ohmic contact layer 15, and the first metal layer 35. For example, the second electrode 82 may include all of the reflective layer 17, the ohmic contact layer 15, and the first metal layer 35 or may selectively include one or two of the reflective layer 17, the ohmic contact layer 15, and the first metal layer 35.

The light emitting device according to the embodiment may include the second metal layer 37 formed on the first insulating layer 33. The second metal layer 37 may include at least one of Au, Cu, Ni, Ti, Ti—W, Cr, W, Pt, V, Fe, and Mo. The second metal layer 37 may be formed by using a material constituting the first metal layer 35. In addition, the first and second metal layers 35 and 37 may be formed by using mutually different materials.

The second insulating layer 40 may be disposed between the first and second metal layers 35 and 37. The second insulating layer 40 may be formed by using oxide or nitride. For example, the second insulating layer 40 may include at least one selected from the group consisting of SiO2, SixOy, Si3N4, SixNy, SiOxNy, Al2O3, TiO2, and AlN. The second insulating layer 40 may be disposed on the first metal layer 35. The second insulating layer 40 may be disposed on the first insulating layer 33. A portion of the second insulating layer 40 may surround the second metal layer 37.

The third metal layer 50 may be disposed on the second metal layer 37. The third metal layer 50 may be electrically connected to the second metal layer 37. A bottom surface of the third metal layer 50 may make contact with a top surface of the second metal layer 37. The third metal layer 50 may be disposed on the second insulating layer 40.

The third metal layer 50 may include at least one of Cu, Ni, Ti, Ti—W, Cr, W, Pt, V, Fe, and Mo. The third metal layer 50 may serve as a diffusion barrier layer. A bonding layer 60 and the conductive support member 70 may be provided on the third metal layer 50.

The third metal layer 50 may prevent a material included in the bonding layer 60 from being diffused to the reflective layer 17 in the process of providing the bonding layer 60. The third metal layer 50 may prevent a material, such as Sn, included in the bonding layer 60 from exerting an influence on the reflective layer 17.

The bonding layer 60 includes barrier metal or bonding metal. For example, the bonding layer 60 may include at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, the first electrode 81 may include at least one of the second metal layer 35, the third metal layer 50, the bonding layer 60 and the conductive support member 70. The first electrode 81 may include all of the second metal layer 35, the third metal layer 50, the bonding layer 60 and the conductive support member 70. In addition, the first electrode 81 may selectively include two or three of the second metal layer 35, the third metal layer 50, the bonding layer 60 and the conductive support member 70.

Next, the substrate 5 is removed from the first conductive semiconductor layer 11. According to one example, the substrate 5 may be removed through a laser lift off (LLO) process. The LLO process is a process to delaminate the substrate 5 from the first conductive semiconductor layer 11 by irradiating a laser to the bottom surface of the substrate 5.

Figure 6:
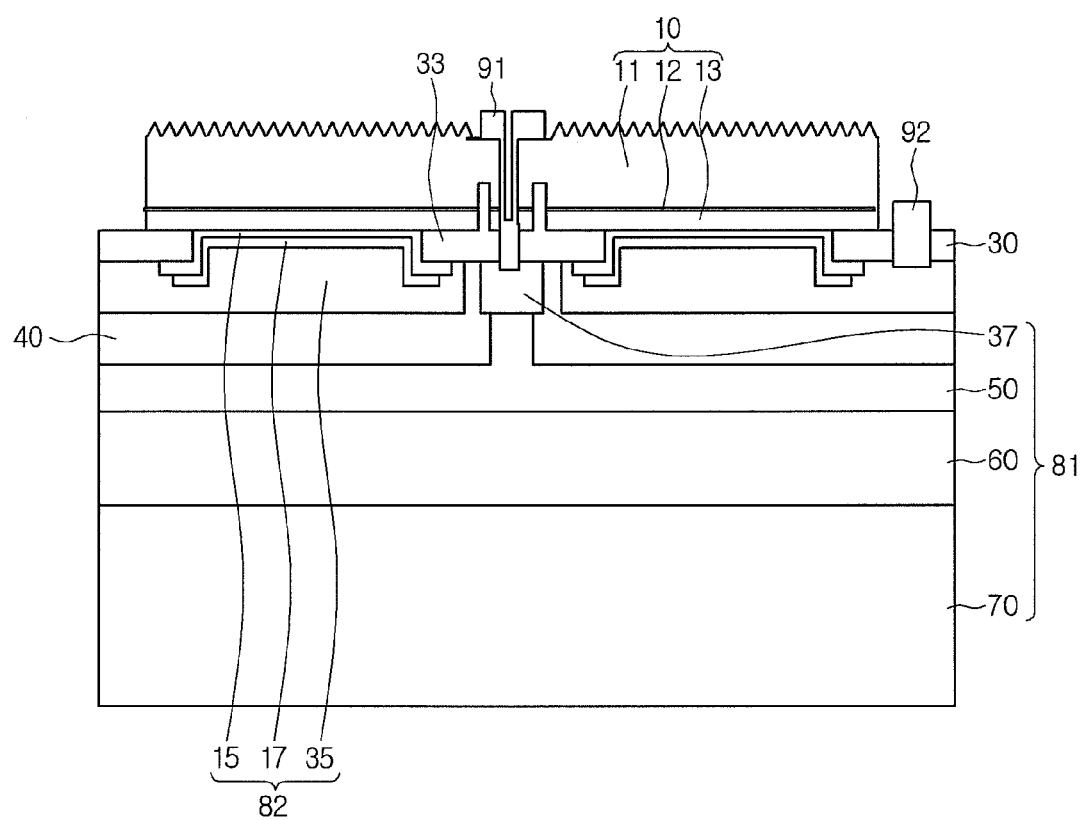

In addition, as shown in FIG. 6, the lateral side of the light emitting structure 10 is etched through an isolation etching process to expose a portion of the channel layer 30. In this case, a portion of the insulating layer 40 may be exposed. The isolation etching process may be performed through a dry etching process such as an inductively coupled plasma (ICP), but the embodiment is not limited thereto.

The roughness may be formed on the top surface of the first conductive semiconductor layer 11. Accordingly, a light extraction pattern may be provided on the light emitting structure 10. A concave-convex pattern may be provided on the light emitting structure 10. For example, the light extraction pattern provided on the light emitting structure 10 may be disposed through a PEC (photo electro chemical) etching process. Therefore, according to the embodiment, the external light extraction effect can be increased.

Next, as shown in FIG. 6, the first and second contact portions 91 and 92 may be formed.

The first conduct portion 91 may be disposed through the light emitting structure 10. The first conduct portion 91 may be disposed through the first conductive semiconductor layer 11, the active layer 12 and the second conductive semiconductor layer 13.

For example, as shown in FIG. 2, a plurality of through holes 20 may be formed in the light emitting structure 10. The first contact portion 91 may be disposed along the through holes 20 of the light emitting structure 10. A first region of the first contact portion 91 may be electrically connected to the first electrode 81 and a second region of the first contact portion 91 may make contact with a top surface of the first conductive semiconductor layer 11. For instance, the first region of the first contact portion 91 may make contact with the second metal layer 37. The first region of the first contact portion 91 may make contact with the top surface of the second metal layer 37.

Although only one first contact portion 91 is illustrated in the light emitting device shown in FIG. 6, the light emitting structure 10 according to the embodiment may be formed with a plurality of through holes 20 as shown in FIG. 2 and the first contact portion 91 may be formed in each through hole 20. Meanwhile, the through hole 20 may have a width or a diameter D in the range of 5 μm to 200 μm. If the through hole 20 has a width or a diameter less than 5 μm, the process to form the first contact portion 91 may be difficult. In addition, if the through hole 20 has a width or a diameter greater 200 μm, the light emitting area of the light emitting structure 10 is reduced so that the light extraction efficiency may be degraded. The first contact portion 91 disposed in the through hole 20 may also have a width or a diameter in the range of 5 μm to 200 μm.

The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

For example, the first contact portions 91 disposed on the top surface of the first conductive semiconductor layer 11 may extend from the peripheral portion of the through hole 20 in the range of 5 μm to 50 μm. The first insulating layer 33 disposed under the through hole 20 may extend from the peripheral portion of the through hole 20 in the range of 5 μm to 70 μm.

According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

A portion of the first insulating layer 33 may be disposed in the light emitting structure 10. A portion of the first insulating layer 33 may be disposed around the first contact portion 91. For example, the portion of the first insulating layer 33 surrounds the first contact portion 91 so that the internal region surrounded by the first insulating layer 33 may be insulated from the external region. The portion of the first insulating layer 33 may be disposed through the second conductive semiconductor layer 13 and the active layer 12. The portion of the first insulating layer 33 may be disposed through the active layer 12 to the extent than the portion has the length equal to or less than 1000 nm in the depth direction.

The portion of the first insulating layer 33, which is disposed through the active layer 12, may have a depth sufficient for insulating the active layer 12 formed inside the first insulating layer 33 from the active layer 12 formed outside the first insulating layer 33.

In addition, the light emitting device according to the embodiment may include the second contact portion 92. The second contact portion 92 may be spaced apart from the light emitting structure 10. The second contact portion 92 may be electrically connected to the second electrode 82. The second contact portion 92 may be electrically connected to the second electrode 82 by passing through the channel layer 30. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials. A top surface of the first contact portion 91 may be located higher than a top surface of the second contact portion 92.

The second electrode 82 according to the embodiment may be disposed under the light emitting structure 10. The second electrode 82 may be electrically connected to the second conductive semiconductor layer 13. The first electrode 81 may be disposed under the light emitting structure 10. The first electrode 81 may be electrically connected to the first conductive semiconductor layer 11. A bottom surface of the first electrode 81 may be located lower than a bottom surface of the second electrode 82.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Figure 7:
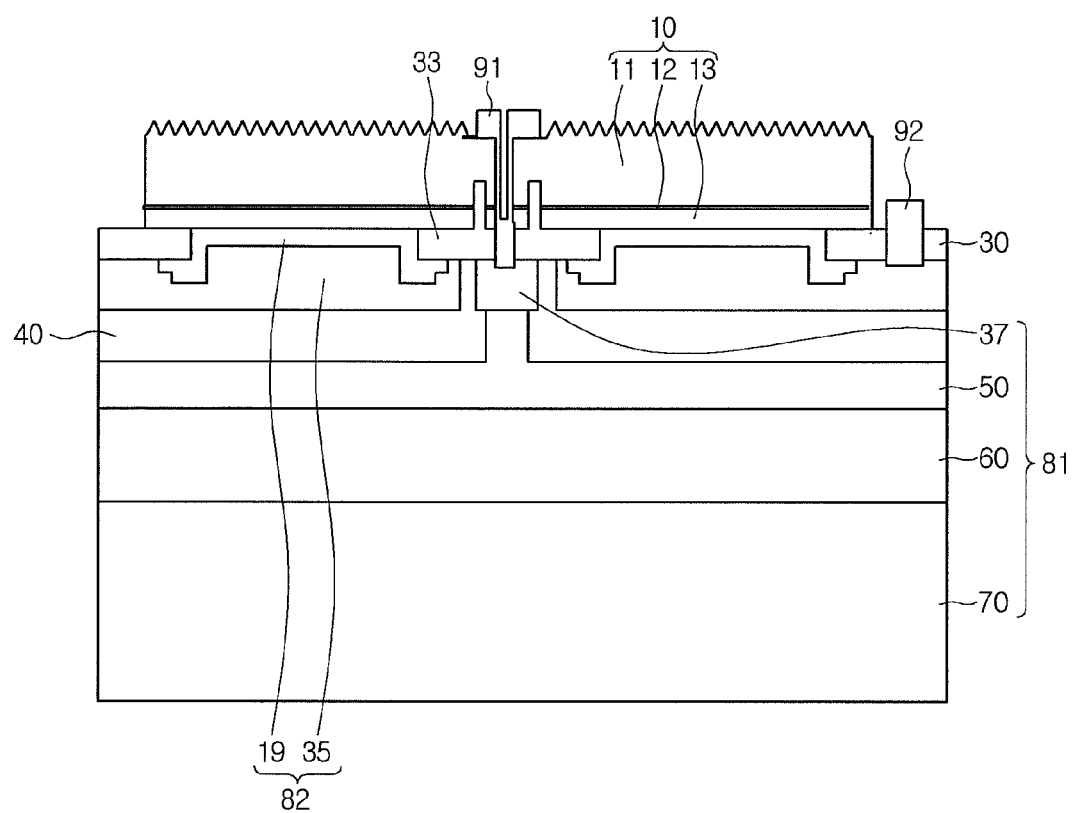
FIG. 7 is a sectional view showing a light emitting device according to another embodiment.

FIG. 7 is a sectional view showing another example of a light emitting device according to the embodiment. In the following description about the light emitting device shown in FIG. 7, components and structures the same as those described with reference to FIGS. 1 and 2 will not be further described in order to avoid redundancy.

According to the light emitting device of the embodiment, an ohmic reflective layer 19 may be provided under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic-contact with the second conductive semiconductor layer 13, and reflect the light incident thereto from the light emitting structure 10.

In this case, the ohmic reflective layer 19 may include multiple layers. For example, the ohmic reflective layer 19 may have a structure in which an Ag layer and a Ni layer are alternately formed, or may include a Ni/Ag/Ni layer, a Ti layer, or a Pt layer.

According to the light emitting device of the embodiment, the conductive support member 70 provided under the ohmic reflective layer 19 may be electrically connected to the first conductive semiconductor layer 11 provided on the ohmic reflective layer 19.

The second electrode 82 according to the embodiment may include at least one of the ohmic reflective layer 19 and the first metal layer 35. In the light emitting device according to the embodiment, the conductive support member 70 provided under the second electrode 82 may be electrically connected to the first conductive semiconductor layer 11 provided on the second electrode 82 through the first contact portion 91.

The first conduct portion 91 may be disposed through the light emitting structure 10. The first conduct portion 91 may be disposed through the first conductive semiconductor layer 11, the active layer 12 and the second conductive semiconductor layer 13.

For example, as shown in FIG. 2, a plurality of through holes 20 may be formed in the light emitting structure 10. The first contact portion 91 may be disposed along the through holes 20 of the light emitting structure 10. A first region of the first contact portion 91 may be electrically connected to the first electrode 81 and a second region of the first contact portion 91 may make contact with a top surface of the first conductive semiconductor layer 11. For instance, the first region of the first contact portion 91 may make contact with the second metal layer 37. The first region of the first contact portion 91 may make contact with the top surface of the second metal layer 37.

Although only one first contact portion 91 is illustrated in the light emitting device shown in FIG. 7, the light emitting structure 10 according to the embodiment may be formed with a plurality of through holes 20 as shown in FIG. 2 and the first contact portion 91 may be formed in each through hole 20. Meanwhile, the through hole 20 may have a width or a diameter D in the range of 5 μm to 200 μm. If the through hole 20 has a width or a diameter less than 5 μm, the process to form the first contact portion 91 may be difficult. In addition, if the through hole 20 has a width or a diameter greater 200 μm, the light emitting area of the light emitting structure 10 is reduced so that the light extraction efficiency may be degraded. The first contact portion 91 disposed in the through hole 20 may also have a width or a diameter in the range of 5 μm to 200 μm.

The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

For example, the first contact portions 91 disposed on the top surface of the first conductive semiconductor layer 11 may extend from the peripheral portion of the through hole 20 in the range of 5 μm to 50 μm. The first insulating layer 33 disposed under the through hole 20 may extend from the peripheral portion of the through hole 20 in the range of 5 μm to 70 μm.

According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

A portion of the first insulating layer 33 may be disposed in the light emitting structure 10. A portion of the first insulating layer 33 may be disposed around the first contact portion 91. For example, the portion of the first insulating layer 33 surrounds the first contact portion 91 so that the internal region surrounded by the first insulating layer 33 may be insulated from the external region. The portion of the first insulating layer 33 may be disposed through the second conductive semiconductor layer 13 and the active layer 12. The portion of the first insulating layer 33 may be disposed through the active layer 12 to the extent than the portion has the length equal to or less than 1000 nm in the depth direction.

The portion of the first insulating layer 33, which is disposed through the active layer 12, may have a depth sufficient for insulating the active layer 12 formed inside the first insulating layer 33 from the active layer 12 formed outside the first insulating layer 33.

In addition, the light emitting device according to the embodiment may include the second contact portion 92. The second contact portion 92 may be spaced apart from the light emitting structure 10. The second contact portion 92 may be electrically connected to the second electrode 82. The second contact portion 92 may be electrically connected to the second electrode 82 by passing through the channel layer 30. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials. A top surface of the first contact portion 91 may be located higher than a top surface of the second contact portion 92.

The second electrode 82 according to the embodiment may be disposed under the light emitting structure 10. The second electrode 82 may be electrically connected to the second conductive semiconductor layer 13. The first electrode 81 may be disposed under the light emitting structure 10. The first electrode 81 may be electrically connected to the first conductive semiconductor layer 11. A bottom surface of the first electrode 81 may be located lower than a bottom surface of the second electrode 82.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Figure 8:
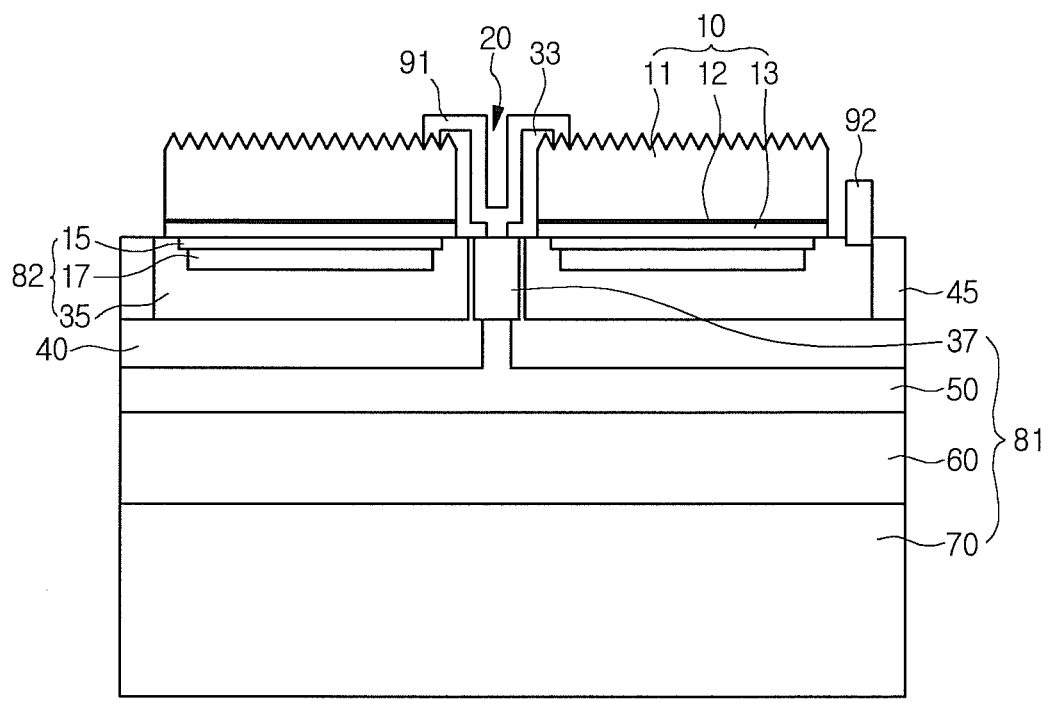
FIG. 8 is a sectional view showing a light emitting device according to still another embodiment.
Figure 9:
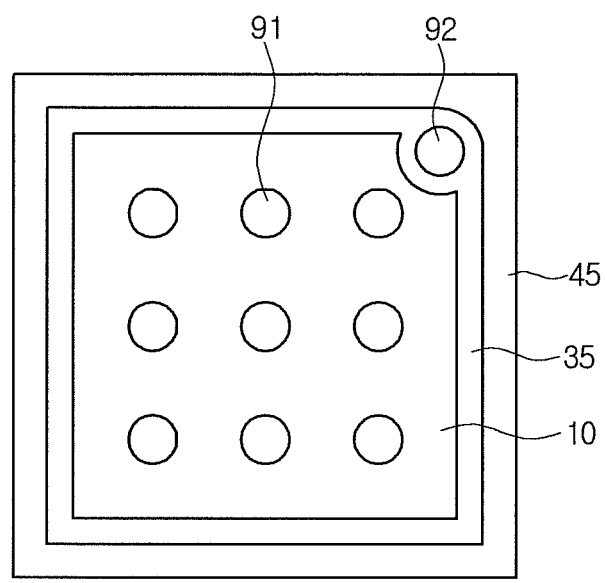
FIG. 9 is a view showing an arrangement of a first contact portion of a light emitting device shown in FIG. 8.

FIG. 8 is a sectional view showing a light emitting device according to the embodiment and FIG. 9 is a view showing an arrangement of the first contact portion of the light emitting device shown in FIG. 8.

As shown in FIGS. 8 and 9, the light emitting device according to the embodiment may include a light emitting structure 10, a first insulating layer 33, a first electrode 81, a second electrode 82 and a first contact portion 91.

The light emitting structure 10 may include a first conductive semiconductor layer 11, an active layer 12, and a second conductive semiconductor layer 13. The active layer 12 may be interposed between the first conductive semiconductor layer 11 and the second conductive semiconductor layer 13. The active layer 12 may be provided under the first conductive semiconductor layer 11, and the second conductive semiconductor layer 13 may be provided under the active layer 12.

The first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor layer. The first conductive semiconductor layer 11 may be realized by using a compound semiconductor. The first conductive semiconductor layer 11 may be realized by using a group II-VI compound semiconductor, or a group III-V compound semiconductor.

For example, the first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may include one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of $In_xAl_yGa_{1-x-y}N$ (0≤x≤1, 0≤y≤1, 0≤x+y≤1). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may include a P-type semiconductor layer. The second conductive semiconductor layer 13 may be realized by using a compound semiconductor. For example, the second conductive semiconductor layer 13 may be realized by using a group II-VI compound semiconductor, or a group II-V compound semiconductor.

For example, the second conductive semiconductor layer 13 may be realized by using a semiconductor material having a compositional formula of $In_xAl_yGa_{1-x-y}N$ (0≤x≤1, 0≤y≤1, 0≤x+y≤1). For example, the second conductive semiconductor layer 13 may include one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided under the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the light emitting structure 10 may have various structures, and the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

The light emitting device according to the embodiment may include a reflective layer 17. The reflective layer may be electrically connected to the second conductive semiconductor layer 13. The reflective layer may be disposed under the light emitting structure 10. The reflective layer may be disposed under the second conductive semiconductor layer 13. The reflective layer 17 may reflect light incident thereto from the light emitting structure 10 to increase the quantity of light extracted to an outside.

The light emitting device according to the embodiment may include an ohmic contact layer 15 interposed between the reflective layer 17 and the second conductive semiconductor layer 13. The ohmic contact layer 15 may make contact with the second conductive semiconductor layer 13. The ohmic contact layer 15 may make ohmic contact with the light emitting structure 10. The ohmic contact layer 15 may include a region that makes ohmic-contact with the light emitting structure 10. The ohmic contact layer 15 may include a region that makes ohmic-contact with the second conductive semiconductor layer 13.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may include a material having high reflectance. For example, the reflective layer 17 may include metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately formed, and may include Ni/Ag/Ni or a Tl layer, and a Pt layer. In addition, the ohmic contact layer 15 may be provided under the reflective layer 17, and at least a portion of the ohmic contact layer 15 may make ohmic-contact with the light emitting structure 10 through the reflective layer 17.

The light emitting device according to the embodiment may include a first metal layer 35 provided under the reflective layer 17. The first metal layer 35 may include at least one of Au, Cu, Ni, Ti, Ti—W, Cr, W, Pt, V, Fe, and Mo.

According to the embodiment, the second electrode 82 may include at least one of the reflective layer 17, the ohmic contact layer 15, and the first metal layer 35. For example, the second electrode 82 may include all of the reflective layer 17, the first metal layer 35, and the ohmic contact layer 15, or may include one or two selected from the of the reflective layer 17, the first metal layer 35, and the ohmic contact layer 15.

The second electrode 82 according to the embodiment may be disposed under the light emitting structure 10. The second electrode 82 may be electrically connected to the second conductive semiconductor layer 13. The second electrode 82 may be exposed at the lower peripheral portion of the light emitting structure 10. The top surface of the second electrode 82 may come into contact with the bottom surface of the second conductive semiconductor layer 13.

As described above, according to the embodiment, the metal layer, other than the insulating layer, may be disposed around the region underneath the light emitting structure 10. That is, the second electrode 82 or the first metal layer 35 may be disposed around the region underneath the light emitting structure 10. Accordingly, the metal layer may directly surround the light emitting structure 10, so the adhesive strength may be improved. As a result, the light emitting structure 10 can be prevented from being broken so that the product yield can be improved. In addition, since the metal layer is disposed around the region underneath the light emitting structure 10, the stability can be ensured under the high current condition.

The first metal layer 35 of the second electrode 82 may come into contact with the bottom surface of the light emitting structure 10. The first metal layer 35 of the second electrode 82 may be exposed at the lower peripheral portion of the light emitting structure 10. One end of the first metal layer 35 may be disposed under the second conductive semiconductor layer 13. The one end of the metal layer 35 may come into contact with the bottom surface of the second conductive semiconductor layer 13.

A third insulating layer 45 may be disposed at the lateral side of the second electrode 42. The third insulating layer 45 may be disposed at the lateral side of the first metal layer 35. The third insulating layer 45 may be disposed around the region underneath the light emitting structure 10. The third insulating layer 45 may include an insulating material. For example, the third insulating layer 45 may be formed by using oxide or nitride. For instance, the third insulating layer 45 may be formed by using at least one selected from the group consisting of $SiO_2$, $Si_xO_y$, $Si_3N_4$, $Si_xN_y$, $SiO_xN_y$, $Al_2O_3$, $TiO_2$, and AlN. The third insulating layer 45 may prevent the electric short between the first and second electrodes 81 and 82 when the scribing process is performed later with respect to the light emitting structure 10.

The light emitting device according to the embodiment may include the first conduct portion 91. The first conduct portion 91 may be disposed through the light emitting structure 10. The first conduct portion 91 may be disposed through the first conductive semiconductor layer 11, the active layer 12 and the second conductive semiconductor layer 13.

For example, as shown in FIG. 9, a plurality of contact portions 91 may be formed in the light emitting structure 10. The first contact portions 91 may be disposed along the through holes 20 of the light emitting structure 10. A first region of the first contact portion 91 may be electrically connected to the first electrode 81 and a second region of the first contact portion 91 may make contact with a top surface of the first conductive semiconductor layer 11. For instance, the first region of the first contact portion 91 may make contact with the second metal layer 37. The first region of the first contact portion 91 may make contact with the top surface of the second metal layer 37. The first region of the first contact portion 91 may make contact with the top surface of the second metal layer 37. For example, when the light emitting structure 10 is grown into a GaN semiconductor layer, the first contact portion 91 may make contact with an n face of the first conductive semiconductor layer 11.

Although only one first contact portion 91 is illustrated in the light emitting device shown in FIG. 8, the light emitting structure 10 according to the embodiment may be formed with a plurality of first contact portions 91 provided in each through hole 20.

The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

A portion of the first insulating layer 33 may be disposed between the light emitting structure 10 and the first contact portion 91. A portion of the first insulating layer 33 may be disposed inside the light emitting structure 10. A portion of the first insulating layer 33 may be disposed around the first contact portion 91. The first insulating layer 33 may be disposed through the first conductive semiconductor layer 11, the active layer 12 and the second conductive semiconductor layer 13.

For example, the first insulating layer 33 may be realized by using oxide or nitride. For example, the first insulating layer 33 may include at least one selected from the group consisting of $SiO_2$, $Si_xO_y$, $Si_3N_4$, $Si_xN_y$, $SiO_xN_y$, $Al_2O_3$, $TiO_2$, and AlN.

For instance, the first insulating layer 33 may be formed on the entire sidewall of the through hole 20 formed perpendicularly to the light emitting structure 10. The first contact portion 91 may be formed on the entire area of the first insulating layer 33. In addition, the first contact portion 91 may be formed on a partial region of the first insulating layer 33. For instance, the first contact portion 91 may be formed in the first region of the first insulating layer 33 and the second region may be exposed to the interior of the through hole 20. In this manner, if the first contact portion 91 is disposed on the partial region of the first insulating layer 33, the light emitted from the light emitting structure may be emitted in the lateral direction of the through hole 20.

The light emitting device according to the embodiment may include a second metal layer 37 provided under the first insulating layer 33. The second metal layer 37 may include at least one of Cu, Ni, Ti, Ti—W, Cr, W, Pt, V, Fe, and Mo. The second metal layer 37 may be formed by using a material constituting the first metal layer 35. In addition, the first and second metal layers 35 and 37 may be formed by using mutually different materials.

A second insulating layer 40 may be disposed between the first and second metal layers 35 and 37. The second insulating layer 40 may be formed by using oxide or nitride. For example, the second insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN. The second insulating layer 40 may be disposed under the first metal layer 35. The second insulating layer 40 may be disposed under the first insulating layer 33.

A third metal layer 50 may be disposed under the second metal layer 37. The third metal layer 50 may be electrically connected to the second metal layer 37. A top surface of the third metal layer 50 may make contact with a bottoms surface of the second metal layer 37. The third metal layer 50 may be disposed under the second insulating layer 40.

The third metal layer 50 may include at least one of Cu, Ni, Ti, Ti—W, Cr, W, Pt, V, Fe, and Mo. The third metal layer 50 may serve as a diffusion barrier layer. A bonding layer 60 and the conductive support member 70 may be provided under the third metal layer 50.

The third metal layer 50 may prevent a material included in the bonding layer 60 from being diffused to the reflective layer 17 in the process of providing the bonding layer 60. The third metal layer 50 may prevent a material, such as Sn, included in the bonding layer 60 from exerting an influence on the reflective layer 17.

The bonding layer 60 includes barrier metal or bonding metal. For example, the bonding layer 60 may include at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, the first electrode 81 may include at least one of the second metal layer 35, the third metal layer 50, the bonding layer 60 and the conductive support member 70. The first electrode 81 may include all of the second metal layer 35, the third metal layer 50, the bonding layer 60 and the conductive support member 70. In addition, the first electrode 81 may selectively include two or three of the second metal layer 35, the third metal layer 50, the bonding layer 60 and the conductive support member 70.

The first electrode 81 may be disposed under the light emitting structure 10. The first electrode 81 may be electrically connected to the first conductive semiconductor layer. A bottom surface of the first electrode 81 may be located lower than a bottom surface of the second electrode 82. The top surface of the first electrode 81 may come into contact with the first contact portion 91 and the first insulating layer 33.

In addition, the light emitting device according to the embodiment may include the second contact portion 92. The second contact portion 92 may be spaced apart from the light emitting structure 10. The second contact portion 92 may be electrically connected to the second electrode 82. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials. A top surface of the first contact portion 91 may be located higher than a top surface of the second contact portion 92.

A roughness may be formed on the top surface of the first conductive semiconductor layer 11. Accordingly, the quantity of light extracted upward at the region where the roughness is formed can be increased.

The light emitting device according to the embodiment may include the second insulating layer 40 interposed between the first metal layer 35 and the third metal layer 50. The second insulating layer 40 may insulate the first metal layer 35 from the third metal layer 50. The second insulating layer 40 may insulate the first metal layer 35 from the conductive support member 70. For example, the second insulating layer 40 may be realized by using oxide or nitride. For example, the second insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN.

A portion of the second insulating layer 40 may surround a peripheral portion of the second metal layer 37. An upper portion of the second insulating layer 40 may make contact with the bottom surface of the first insulating layer 33.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Hereinafter, a method of fabricating the light emitting device according to the embodiment will be described with reference to FIGS. 10 to 13.

Figure 10:
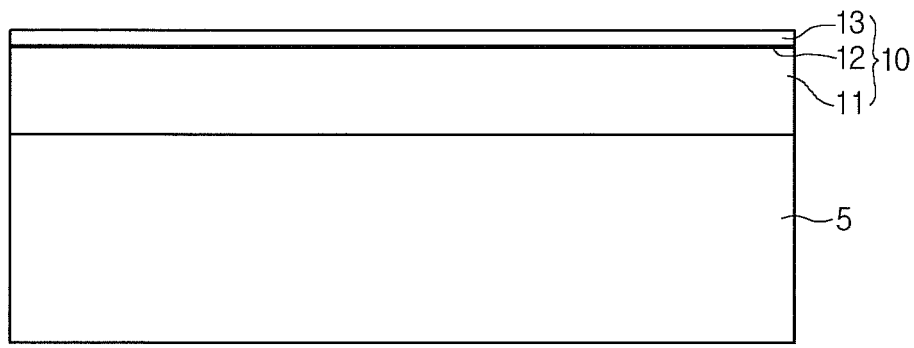
FIGS. 10 to 13 are sectional views showing a method of fabricating a light emitting device according to the embodiment.

According to the method of fabricating the light emitting device of the embodiment, as shown in FIG. 10, the first conductive semiconductor layer 11, the active layer 12, and the second conductive semiconductor layer 13 may be formed on the substrate 5. The first conductive semiconductor layer 11, the active layer 12, and the second conductive semiconductor layer 13 may be defined as the light emitting structure 10.

For example, the substrate 5 may include at least one of a sapphire substrate ($Al_2O_3$), SiC, GaAs, GaN, ZnO, Si, GaP, InP, and Ge, but the embodiment is not limited thereto. A buffer layer may be interposed between the first conductive semiconductor layer 11 and the substrate 5.

The first conductive semiconductor layer 11 may include an N-type semiconductor layer doped with N-type dopants serving as first conductive dopants, and the second conductive semiconductor layer 13 may include a P-type semiconductor layer doped with P-type dopants serving as second conductive dopants. In addition, the first conductive semiconductor layer 11 may include a P-type semiconductor layer, and the second conductive semiconductor layer 13 may include an N-type semiconductor layer.

For example, the first conductive semiconductor layer 11 may include an N-type semiconductor. The first conductive semiconductor layer 11 may include a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may include one selected from the group consisting of InAlGaN, GaN, AlGaN, AlInN, InGaN, AlN, and InN, and may be doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a semiconductor material having a compositional formula of $In_xAl_yGa_{1-x-y}N$ ($0 \le x \le 1$, $0 \le y \le 1$, $0 \le x+y \le 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may be realized by using a P type semiconductor. The second conductive semiconductor layer 13 may be realized by using a semiconductor material having a compositional formula of $In_xAl_yGa_{1-x-y}N$ ($0 \le x \le 1$, $0 \le x+y \le 1$). For example, the second conductive semiconductor layer 13 may include one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may include a P-type semiconductor layer and the second conductive semiconductor layer 13 may include the N-type semiconductor layer. In addition, a semiconductor layer including an N-type or P-type semiconductor layer may be additionally provided on the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform doping concentration. In other words, the light emitting structure 10 may have various structures, and the embodiment is not limited thereto.

In addition, the first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

Figure 11:
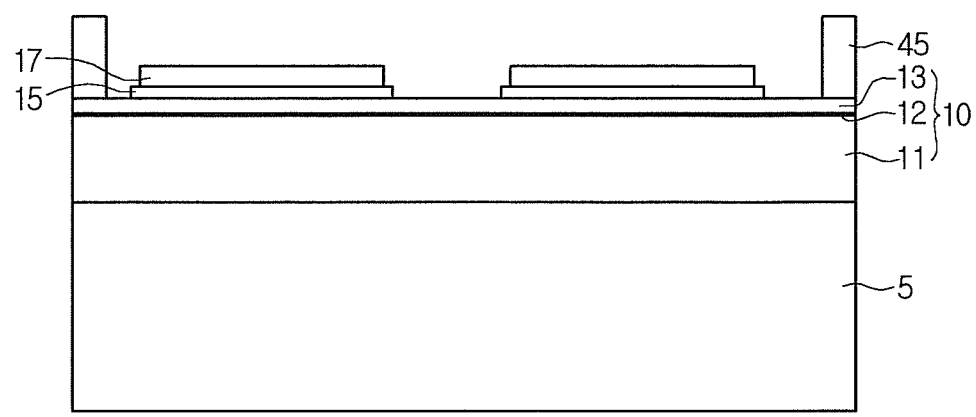

Then, as shown in FIG. 11, the light emitting structure 10 may be provided thereon with the third insulating layer 45, the ohmic contact layer 15 and the reflective layer 17.

The third insulating layer 45 may include an insulating material. For instance, the third insulating layer 45 may be formed by using oxide or nitride. For example, the third insulating layer 45 may be formed by using at least one selected from the group consisting of $SiO_2$, $Si_xO_y$, $Si_3N_4$, $Si_xN_y$, $SiO_xN_y$, $Al_2O_3$, $TiO_2$, and AlN.

The ohmic contact layer 15 may be interposed between the reflective layer 17 and the second conductive semiconductor layer 13. The ohmic contact layer 15 may make contact with the second conductive semiconductor layer 13.

The ohmic contact layer 15 may make ohmic-contact with the light emitting structure 10. The reflective layer 17 may be electrically connected to the second conductive semiconductor layer 13. The ohmic contact layer 15 may include an ohmic-contact region that makes ohmic-contact with the light emitting structure 10.

For example, the ohmic contact layer 15 may include a transparent conductive oxide layer. For example, the ohmic contact layer 15 may include at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may include a material having high reflectance. For example, the reflective layer 17 may include metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may include at least one of Ag, Al, an Ag—Pd—Cu alloy, and an Ag—Cu alloy.

For example, the reflective layer 17 may have a structure in which an Ag layer and a Ni layer are alternately formed, and may include Ni/Ag/Ni or a Tl layer, and a Pt layer. In addition, the ohmic contact layer 15 may be provided under the reflective layer 17, and at least a portion of the ohmic contact layer 15 may make ohmic-contact with the light emitting structure 10 through the reflective layer 17.

Figure 12:
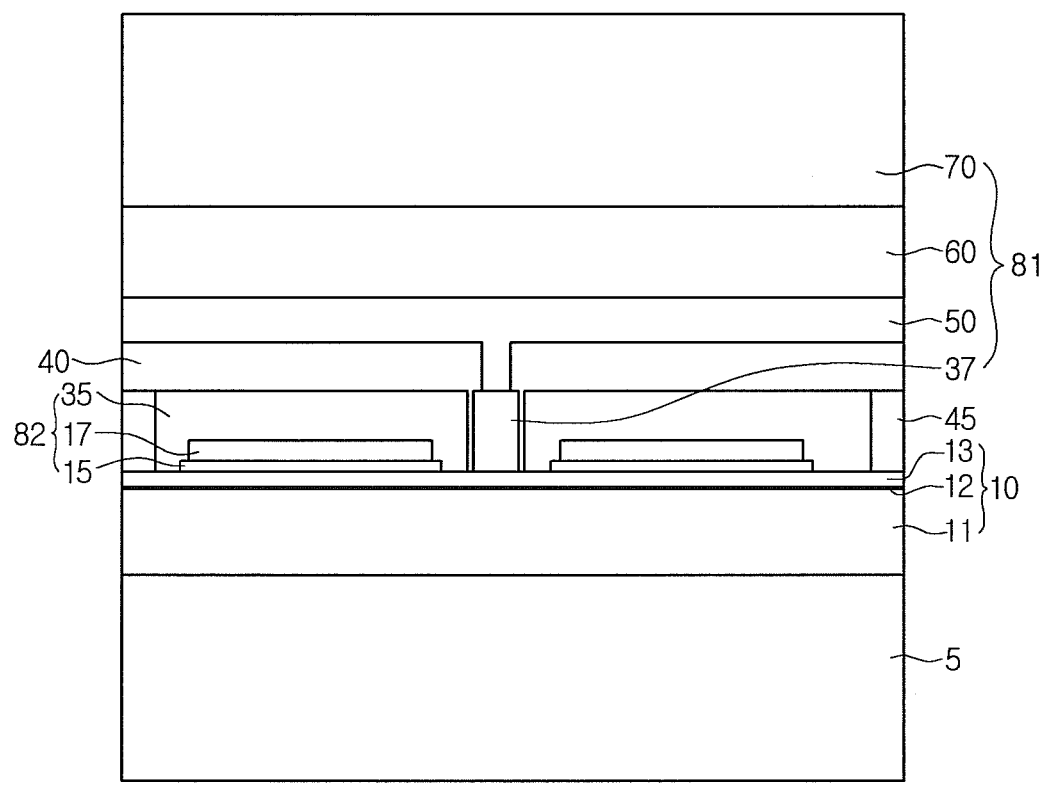

Thereafter, as shown in FIG. 12, the first metal layer 35, the second metal layer 37, the second insulating layer 40, the third metal layer 50, the bonding layer 60, and the conductive support member 70 may be formed on the reflective layer 17.

The first metal layer 35 may include at least one selected from the group consisting of Au, Cu, Ni, Ti, Ti—W, Cr, W, Pt, V, Fe, and Mo. According to the embodiment, the second electrode 82 may include at least one of the reflective layer 17, the ohmic contact layer 15, and the first metal layer 35. For example, the second electrode 82 may include all of the reflective layer 17, the ohmic contact layer 15, and the first metal layer 35 or may selectively include one or two of the reflective layer 17, the ohmic contact layer 15, and the first metal layer 35.

The second metal layer 37 may include at least one of Au, Cu, Ni, Ti, Ti—W, Cr, W, Pt, V, Fe, and Mo. The second metal layer 37 may be formed by using a material constituting the first metal layer 35. In addition, the first and second metal layers 35 and 37 may be formed by using mutually different materials.

The second insulating layer 40 may be disposed between the first and second metal layers 35 and 37. The second insulating layer 40 may be formed by using oxide or nitride. For example, the second insulating layer 40 may include at least one selected from the group consisting of $SiO_2$, $Si_xO_y$, $Si_3N_4$, $Si_xN_y$, $SiO_xN_y$, $Al_2O_3$, $TiO_2$, and AlN. The second insulating layer 40 may be disposed on the first metal layer 35. The second insulating layer 40 may be disposed on the first insulating layer 33. A portion of the second insulating layer 40 may surround the second metal layer 37.

The third metal layer 50 may be disposed on the second metal layer 37. The third metal layer 50 may be electrically connected to the second metal layer 37. A bottom surface of the third metal layer 50 may make contact with a top surface of the second metal layer 37. The third metal layer 50 may be disposed on the second insulating layer 40.

The third metal layer 50 may include at least one of Cu, Ni, Ti, Ti—W, Cr, W, Pt, V, Fe, and Mo. The third metal layer 50 may serve as a diffusion barrier layer. A bonding layer 60 and the conductive support member 70 may be provided on the third metal layer 50.

The third metal layer 50 may prevent a material included in the bonding layer 60 from being diffused to the reflective layer 17 in the process of providing the bonding layer 60. The third metal layer 50 may prevent a material, such as Sn, included in the bonding layer 60 from exerting an influence on the reflective layer 17.

The bonding layer 60 includes barrier metal or bonding metal. For example, the bonding layer 60 may include at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may include at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, the first electrode 81 may include at least one of the second metal layer 35, the third metal layer 50, the bonding layer 60 and the conductive support member 70. The first electrode 81 may include all of the second metal layer 35, the third metal layer 50, the bonding layer 60 and the conductive support member 70. In addition, the first electrode 81 may selectively include two or three of the second metal layer 35, the third metal layer 50, the bonding layer 60 and the conductive support member 70.

Next, the substrate 5 is removed from the first conductive semiconductor layer 11. According to one example, the substrate 5 may be removed through a laser lift off (LLO) process. The LLO process is a process to delaminate the substrate 5 from the first conductive semiconductor layer 11 by irradiating a laser to the bottom surface of the substrate 5.

Figure 13:
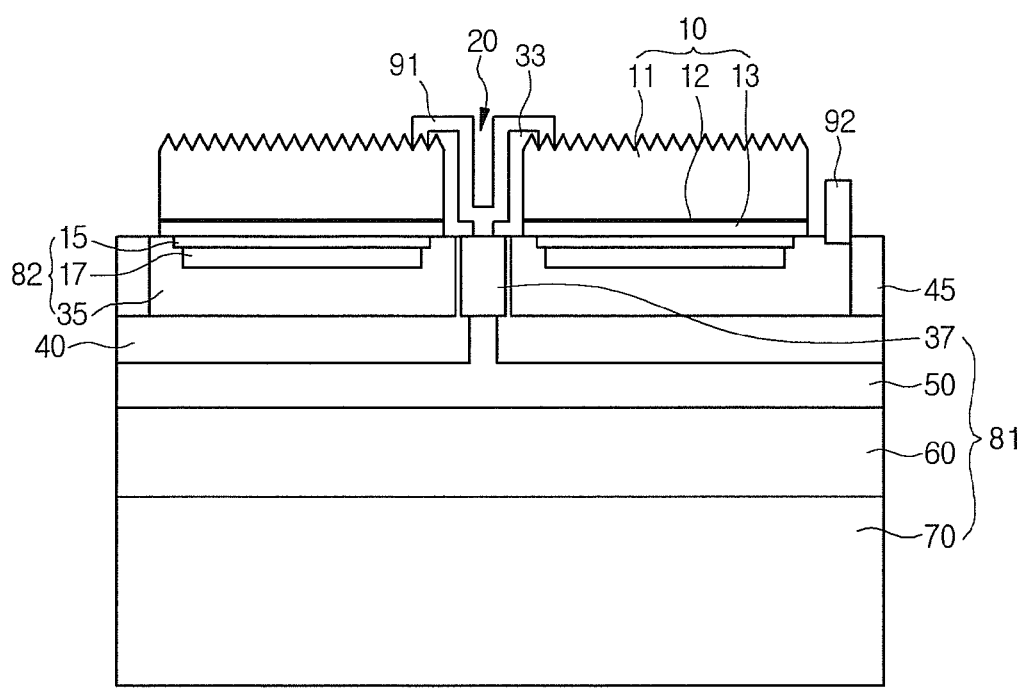

In addition, as shown in FIG. 13, the lateral side of the light emitting structure 10 is etched through an isolation etching process to expose a portion of the second electrode 82. In this case, a portion of the first metal layer 35 may be exposed through the isolation etching process. In addition, the third insulating layer 45 may be exposed through the isolation etching process. The isolation etching process may be performed through a dry etching process such as an inductively coupled plasma (ICP), but the embodiment is not limited thereto.

The roughness may be formed on the top surface of the first conductive semiconductor layer 11. Accordingly, a light extraction pattern may be provided on the light emitting structure 10. A concave-convex pattern may be provided on the light emitting structure 10. For example, the light extraction pattern provided on the light emitting structure 10 may be disposed through a PEC (photo electro chemical) etching process. Therefore, according to the embodiment, the external light extraction effect can be increased.

Next, as shown in FIG. 13, the first insulating layer 33, and the first and second contact portions 91 and 92 may be formed.

The first insulating layer 33 may be disposed through the light emitting structure 10. The first insulating layer 33 may come into contact with the second insulating layer 40 through the light emitting structure 10. The first insulating layer 33 may come into contact with the second metal layer 37 through the light emitting structure 10. The first insulating layer 33 may come into contact with the top surface of the second metal layer 37 through the light emitting structure 10.

The first conduct portion 91 may be disposed through the light emitting structure 10. The first conduct portion 91 may be disposed through the first conductive semiconductor layer 11, the active layer 12 and the second conductive semiconductor layer 13. The first conduct portion 91 may be formed on the first insulating layer 33.

For example, as shown in FIG. 9, a plurality of contact portions 91 may be formed in the light emitting structure 10. The first contact portions 91 may be disposed along the through holes 20 of the light emitting structure 10. A first region of the first contact portion 91 may be electrically connected to the first electrode 81 and a second region of the first contact portion 91 may make contact with a top surface of the first conductive semiconductor layer 11. For instance, the first region of the first contact portion 91 may make contact with the second metal layer 37. The first region of the first contact portion 91 may make contact with the top surface of the second metal layer 37. The first region of the first contact portion 91 may make contact with the top surface of the second metal layer 37.

Although only one first contact portion 91 is illustrated in the light emitting device shown in FIG. 13, the light emitting structure 10 according to the embodiment may be formed with a plurality of first contact portions 91 provided in each through hole 20.

The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

A portion of the first insulating layer 33 may be disposed in the light emitting structure 10. A portion of the first insulating layer 33 may be disposed around the first contact portion 91. The portion of the first insulating layer 33 may be disposed through the first conductive semiconductor layer 11, the active layer 12 and the second conductive semiconductor layer 13.

In addition, the light emitting device according to the embodiment may include the second contact portion 92. The second contact portion 92 may be spaced apart from the light emitting structure 10. The second contact portion 92 may be electrically connected to the second electrode 82. The second contact portion 92 may be electrically connected to the second electrode 82. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials. A top surface of the first contact portion 91 may be located higher than a top surface of the second contact portion 92.

Meanwhile, the above process is illustrative purpose only and may be variously modified according to designs of the light emitting device.

The second electrode 82 according to the embodiment may be disposed under the light emitting structure 10. The second electrode 82 may be electrically connected to the second conductive semiconductor layer 13. The first electrode 81 may be disposed under the light emitting structure 10. The first electrode 81 may be electrically connected to the first conductive semiconductor layer 11. A bottom surface of the first electrode 81 may be located lower than a bottom surface of the second electrode 82.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

According to the embodiment, the metal layer, other than the insulating layer, may be disposed around the region underneath the light emitting structure 10. That is, the second electrode 82 or the first metal layer 35 may be disposed around the region underneath the light emitting structure 10. Accordingly, the metal layer may directly surround the light emitting structure 10, so the adhesive strength may be improved. As a result, the light emitting structure 10 can be prevented from being broken so that the product yield can be improved. In addition, since the metal layer is disposed around the region underneath the light emitting structure 10, the stability can be ensured under the high current condition.

Figure 14:
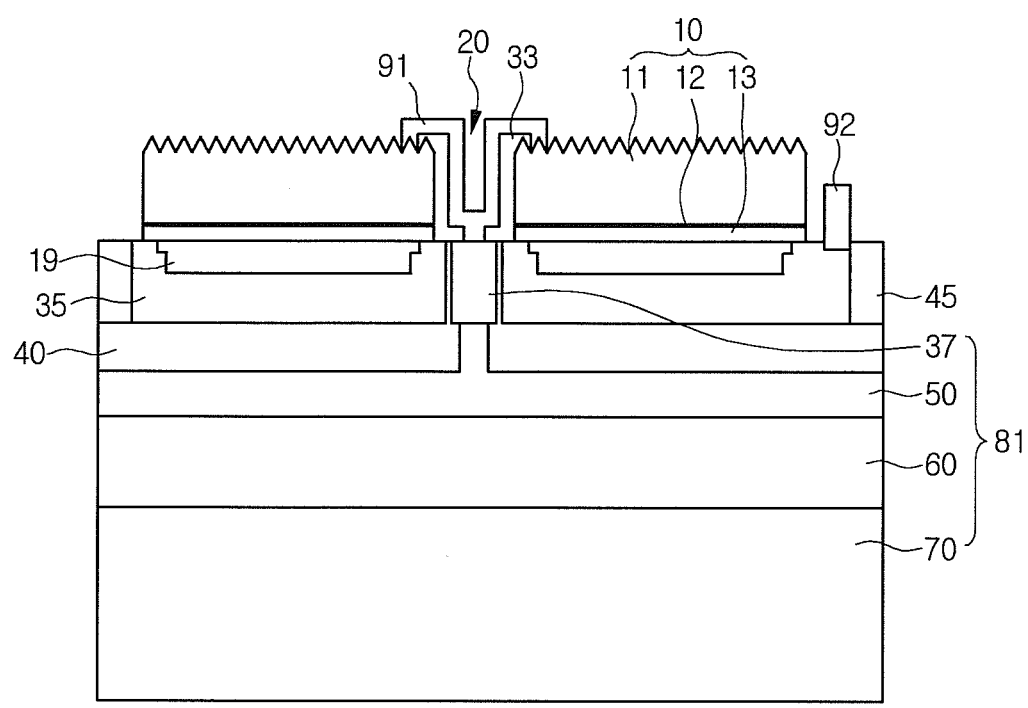
FIG. 14 is a sectional view showing a light emitting device according to another embodiment.

FIG. 14 is a sectional view showing another example of a light emitting device according to the embodiment. In the following description about the light emitting device shown in FIG. 14, components and structures the same as those described with reference to FIGS. 8 and 9 will not be further described in order to avoid redundancy.

According to the light emitting device of the embodiment, an ohmic reflective layer 19 may be provided under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic-contact with the second conductive semiconductor layer 13, and reflect the light incident thereto from the light emitting structure 10.

In this case, the ohmic reflective layer 19 may include multiple layers. For example, the ohmic reflective layer 19 may have a structure in which an Ag layer and a Ni layer are alternately formed, or may include a Ni/Ag/Ni layer, a Ti layer, or a Pt layer.

According to the light emitting device of the embodiment, the conductive support member 70 provided under the ohmic reflective layer 19 may be electrically connected to the first conductive semiconductor layer 11 provided on the ohmic reflective layer 19.

The second electrode 82 according to the embodiment may include at least one of the ohmic reflective layer 19 and the first metal layer 35. In the light emitting device according to the embodiment, the conductive support member 70 provided under the second electrode 82 may be electrically connected to the first conductive semiconductor layer 11 provided on the second electrode 82 through the first contact portion 91.

The first conduct portion 91 may be disposed through the light emitting structure 10. The first conduct portion 91 may be disposed through the first conductive semiconductor layer 11, the active layer 12 and the second conductive semiconductor layer 13.

For example, as shown in FIG. 9, a plurality of first contact portions 91 may be formed in the light emitting structure 10. The first contact portion 91 may be disposed along the through holes 20 of the light emitting structure 10. A first region of the first contact portion 91 may be electrically connected to the first electrode 81 and a second region of the first contact portion 91 may make contact with a top surface of the first conductive semiconductor layer 11. For instance, the first region of the first contact portion 91 may make contact with the second metal layer 37. The first region of the first contact portion 91 may make contact with the top surface of the second metal layer 37.

Although only one first contact portion 91 is illustrated in the light emitting device shown in FIG. 14, the light emitting structure 10 according to the embodiment may be formed with a plurality of first contact portions as shown in FIG. 9 and the first contact portion 91 may be formed in each through hole 20.

The first contact portions 91 may be spaced apart from each other on the top surface of the first conductive semiconductor layer 11. Since the first contact portions 91 are distributed on the light emitting structure 10, current applied to the first conductive semiconductor layer 11 may be spread. Thus, the degradation of the first conductive semiconductor layer 11 can be prevented and the combination efficiency of the electrons and holes in the active layer 12 can be improved.

According to the embodiment, the first contact portion 91 may include an ohmic layer, an intermediate layer, and an upper layer. The ohmic layer may include a material selected from the group consisting of Cr, V, W, Ti, and Zn, and may make ohmic contact. The intermediate layer may be realized by using a material selected from the group consisting of Ni, Cu, and Al. For example, the upper layer may include Au. The first contact portion 91 may include at least one selected from the group consisting of Cr, V, W, Ti, Zn, Ni, Cu, Al, Au and Mo.

A portion of the first insulating layer 33 may be disposed in the light emitting structure 10. A portion of the first insulating layer 33 may be disposed around the first contact portion 91. A portion of the first insulating layer 33 may be disposed through the first conductive semiconductor layer 11, the active layer 12 and the second conductive semiconductor layer 13.

In addition, the light emitting device according to the embodiment may include the second contact portion 92. The second contact portion 92 may be spaced apart from the light emitting structure 10. The second contact portion 92 may be electrically connected to the second electrode 82. The second contact portion 92 may be electrically connected to the second electrode 82 by passing through the channel layer 30. The second contact portion 92 may be electrically connected to the first metal layer 35. The second contact portion 92 may come into contact with the top surface of the first metal layer 35. The second contact portion 92 may include at least one of Cr, V, W, Ti, Zn, Ni, Cu, Al, Au, and Mo. The second contact portion 92 may be formed by using a material constituting the first contact portion 91. In addition, the first and second contact portions 91 and 92 may be formed by using mutually different materials. A top surface of the first contact portion 91 may be located higher than a top surface of the second contact portion 92.

The second electrode 82 according to the embodiment may be disposed under the light emitting structure 10. The second electrode 82 may be electrically connected to the second conductive semiconductor layer 13. The first electrode 81 may be disposed under the light emitting structure 10. The first electrode 81 may be electrically connected to the first conductive semiconductor layer 11. A bottom surface of the first electrode 81 may be located lower than a bottom surface of the second electrode 82.

The second insulating layer 40 may be disposed between the first and second electrodes 81 and 82. The second insulating layer 40 may electrically insulate the first electrode 81 from the second electrode 82.

According to the embodiment, power may be applied to the light emitting structure 10 through the first electrode 81 and the second electrode 82. For example, in the light emitting device according to the embodiment, the power may be applied to the light emitting structure 10 through the conductive support member 70 of the first electrode 81 and the second contact portion 92.

Accordingly, power may be supplied to the first conductive semiconductor layer 11 through a scheme of attaching the conductive support member 70 to the bonding pad. According to the embodiment, the second contact portion 92 may be electrically connected to the second electrode 82. Therefore, the second contact portion 92 is connected to a power pad through a wire bonding scheme, thereby supplying power to the second conductive semiconductor layer 13.

According to the light emitting device of the embodiment, power may be supplied to the light emitting structure 10 through the conductive support member 70 and the second contact portion 92. Therefore, according to the embodiment, current concentration can be prevented, and the electrical reliability can be improved.

In the light emitting device according to the embodiment, the through holes 20 are formed from the top surface of the light emitting structure 10. Thus, the manufacturing process can be simplified and the product yield can be improved. In addition, according to the light emitting device of the embodiment, an area of the electrode disposed on the top surface of the light emitting structure 10 can be reduced so that a protective layer may be omitted from the top surface or lateral side of the light emitting structure 10. Therefore, the extraction efficiency of light emitted to the outside from the light emitting structure 10 can be improved.

Figure 15:
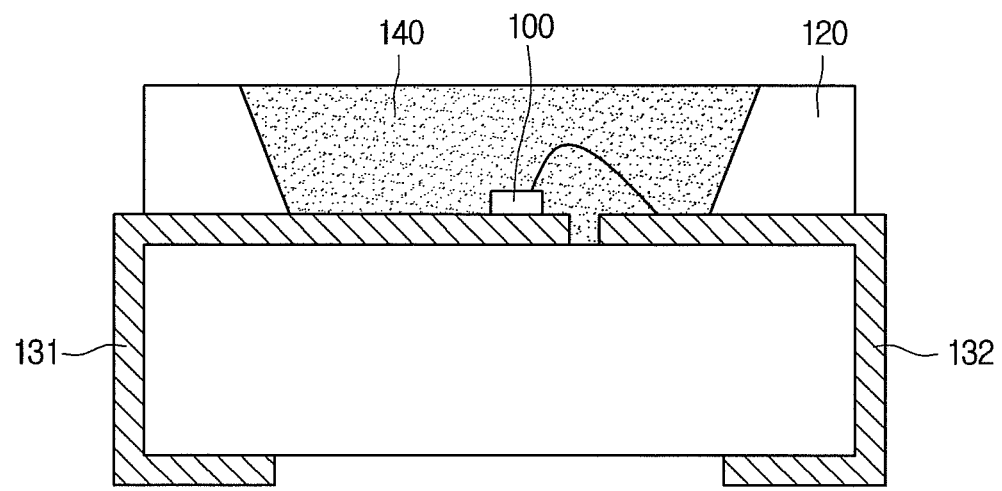
FIG. 15 is a sectional view showing a light emitting device package according to the embodiment.

FIG. 15 is a sectional view showing a light emitting device package to which the light emitting device according to the embodiment is applied.

Referring to FIG. 15, the light emitting device package according to the embodiment may include a body 120, first and second lead electrodes 131 and 132 formed on the body 120, a light emitting device 100 provided on the body 120 and electrically connected to the first and second lead electrodes 131 and 132 and a molding member 140 that surrounds the light emitting device 100.

The body 120 may include silicon, synthetic resin or metallic material, and an inclined surface may be formed in the vicinity of the light emitting device 100.

The first and second lead electrodes 131 and 132 are electrically isolated from each other to supply power to the light emitting device 100. The first and second lead electrode 131 and 132 can improve the light efficiency by reflecting the light emitted from the light emitting device 100. Further, the first and second lead electrodes 131 and 132 dissipate heat generated from the light emitting device 100 to the outside.

The light emitting device 100 can be installed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may include phosphors to change the wavelength of the light emitted from the light emitting device 100.

A plurality of light emitting device or light emitting device packages according to the embodiment may be arrayed on a board, and an optical member including a lens, a light guide plate, a prism sheet, or a diffusion sheet may be provided on the optical path of the light emitted from the light emitting device package. The light emitting device package, the board, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can include a light emitting device, or a light emitting device package according to the embodiment. For example, the lighting apparatus may include a lamp, a signal lamp, an electric sign board and a headlight of a vehicle.

Figure 17:
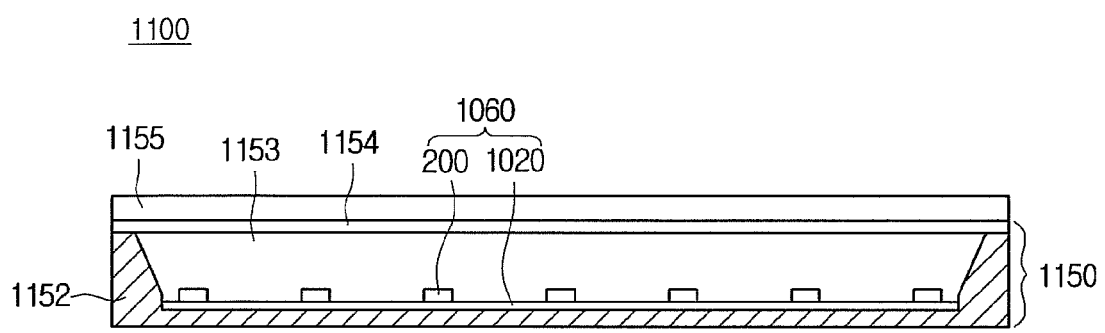
FIG. 17 is a sectional view showing another example of the display device according to the embodiment.
Figure 18:
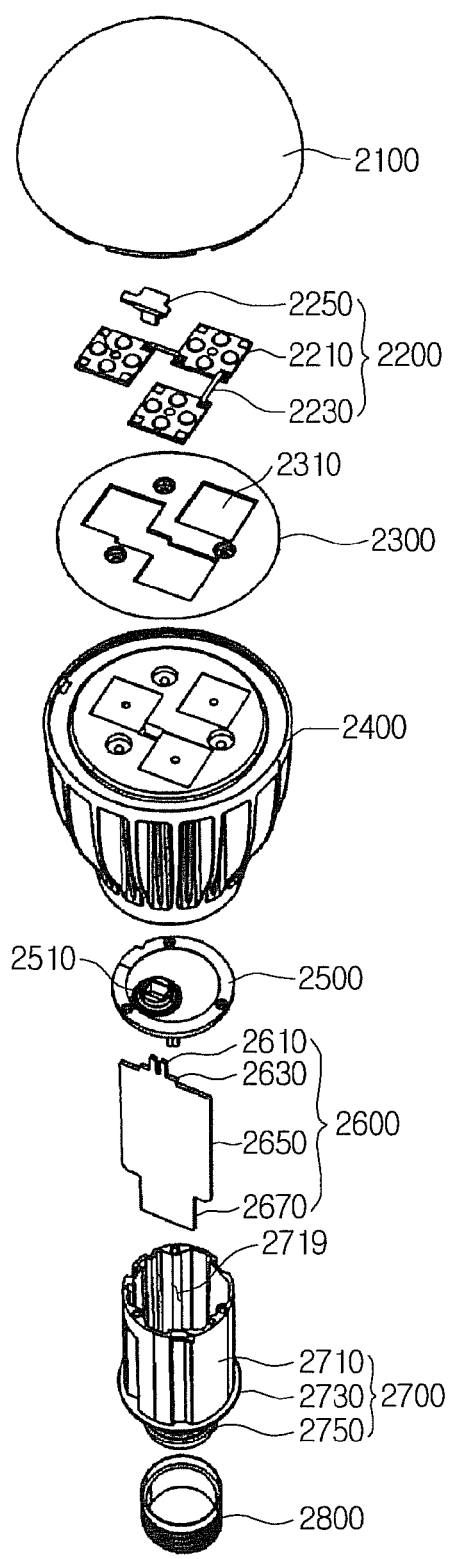
FIG. 18 is an exploded perspective view showing a light unit according to the embodiment.

The light emitting device according to the embodiment may be applied to the light unit. The light unit has a structure in which a plurality of light emitting devices are arrayed. The light unit may include a display device as shown in FIGS. 16 and 17 and the lighting apparatus as shown in FIG. 18.

Figure 16:
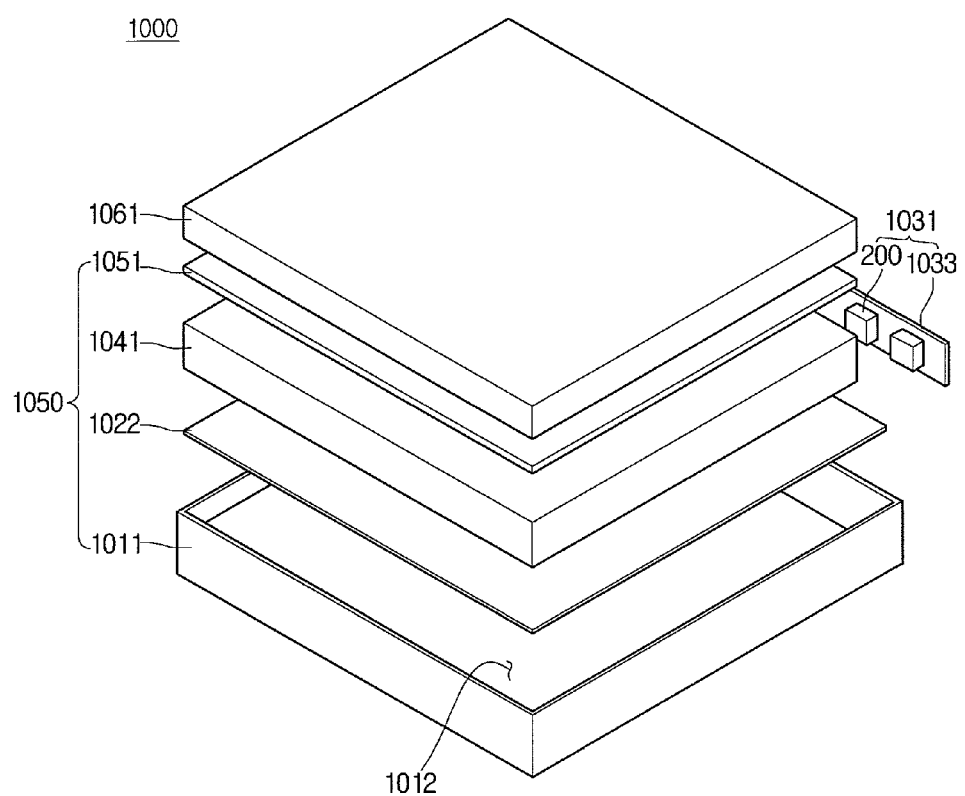
FIG. 16 is an exploded perspective view showing a display device according to the embodiment.

Referring to FIG. 16, a display device 1000 according to the embodiment includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041 and the optical sheet 1051 may constitute a light unit 1050.

The light guide plate 1041 diffuses the light to provide surface light. The light guide plate 1041 may include transparent material. For example, the light guide plate 1041 may include one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a board 1033 and light emitting devices 100 or the light emitting device package 200 according to the embodiment described above. The light emitting packages 200 may be arrayed on the board 1033 while being spaced apart from each other at the predetermined interval.

The board 1033 may be a printed circuit board (PCB) including a circuit pattern. In addition, the board 1033 may also include a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the board 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and includes at least one transmissive sheet. For example, the optical sheet 1051 includes at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

FIG. 17 is a sectional view showing another example of a display device according to the embodiment.

Referring to FIG. 17, the display device 1100 includes a bottom cover 1152, a board 1020 on which the light emitting devices 100 are arrayed, an optical member 1154, and a display panel 1155. The board 1020 and the light emitting device packages 200 may constitute a light emitting module 1060. In addition, the bottom cover 1152, at least one light emitting module 1060, and the optical member 1154 may constitute the light unit. The bottom cover 1152 can be provided therein with a receiving section 1153, but the embodiment is not limited thereto.

In this case, the optical member 1154 may include at least one of a lens, a light guide plate, a diffusion sheet, horizontal and vertical prism sheets, and a brightness enhanced sheet. The light guide plate may include PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 18 is a perspective view showing a lighting apparatus according to the embodiment.

Referring to FIG. 18, the lighting apparatus according to the embodiment may include a cover 2100, a light source module 2200, a radiator 2400, a power supply part 2600, an inner case 2700, and a socket 2800. The lighting apparatus according to the embodiment may further include at least one of a member 2300 and a holder 2500. The light source module 2200 may include the light emitting device package according to the embodiment.

For example, the cover 2100 may have a blub shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may include a coupling part which is coupled with the radiator 2400.

The cover 2100 may include an inner surface coated with a milk-white pigment. The milk-white pigment may include a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may include glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be disposed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed on a top surface of the radiator 2400, and includes guide grooves 2310 into which a plurality of light sources 2210 and the connector 2250 are inserted. The guide grooves 2310 correspond to a board of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100. Accordingly, the light efficiency of the lighting apparatus according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 includes a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may include a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800

The inner case 2700 may include a molding part therein together with the power supply part 2600. The molding part is prepared by hardening molding liquid, and the power supply part 2600 may be fixed inside the inner case 2700 by the molding part.

The embodiment provides a light emitting device capable of improving light extraction efficiency and product yield, a light emitting device package, and a light unit.

A light emitting device according to the embodiment includes a light emitting structure comprising a first conductive semiconductor layer, an active layer disposed under the first conductive semiconductor layer, and a second conductive semiconductor layer disposed under the active layer; a first electrode disposed under the light emitting structure and electrically connected to the first conductive semiconductor layer; a second electrode disposed under the light emitting structure and electrically connected to the second conductive semiconductor layer; and a first contact portion disposed through the light emitting structure and including a first region electrically connected to the first electrode and a second region making contact with a top surface of the first conductive semiconductor layer.

A light emitting device according to the embodiment includes a light emitting structure comprising a first conductive semiconductor layer, an active layer disposed under the first conductive semiconductor layer, and a second conductive semiconductor layer disposed under the active layer; a first electrode disposed under the light emitting structure and electrically connected to the first conductive semiconductor layer; a second electrode disposed under the light emitting structure and electrically connected to the second conductive semiconductor layer; a first contact portion disposed through the light emitting structure and including a first region electrically connected to the first electrode and a second region making contact with a top surface of the first conductive semiconductor layer; and a first insulating layer disposed around the first contact portion, wherein the first insulating layer is disposed through the second conductive semiconductor layer and the active layer.

A light emitting device according to the embodiment includes a light emitting structure comprising a first conductive semiconductor layer, an active layer disposed under the first conductive semiconductor layer, and a second conductive semiconductor layer disposed under the active layer; a first electrode disposed under the light emitting structure and electrically connected to the first conductive semiconductor layer; a second electrode disposed under the light emitting structure and electrically connected to the second conductive semiconductor layer; a plurality of first contact portions disposed through the light emitting structure and including a first region electrically connected to the first electrode and a second region making contact with a top surface of the first conductive semiconductor layer; and a second contact portion spaced apart from the light emitting structure and electrically connected to the second electrode, wherein the plurality of first contact portions are spaced apart from each other on the top surface of the first conductive semiconductor layer, and a top surface of the first contact portion is located higher than a top surface of the second contact portion.

The light emitting device, the light emitting device package and the light unit according to the embodiment can improve the light extraction efficiency and product yield.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure including a first conductive semiconductor layer, an active layer provided under the first conductive semiconductor layer, and a second conductive semiconductor layer provided under the active layer;
   a first electrode provided under the light emitting structure and electrically connected to the first conductive semiconductor layer;
   a second electrode provided under the light emitting structure and electrically connected to the second conductive semiconductor layer;
   a first contact portion provided through the light emitting structure and including a first region electrically connected to the first electrode and a second region contacting a top surface of the first conductive semiconductor layer; and
   a first insulating layer including a first portion disposed under the second conductive semiconductor layer and a second portion disposed in the second conductive semiconductor layer and the active layer, wherein the second portion is provided around the first contact portion and the second portion is spaced apart from the first contact portion,
   wherein a through hole is provided from the top surface of the first conductive semiconductor layer to a bottom surface of the first portion of the first insulating layer, and
   wherein the first contact portion is provided in the through hole, and the first contact portion includes the first region contacting the top surface of the first electrode and the second region is disposed on the top surface of the first conductive semiconductor layer.

2. The light emitting device of claim 1, further comprising a second contact portion spaced apart from the light emitting structure and electrically connected to the second electrode.

3. The light emitting device of claim 2, further comprising a channel layer disposed around a region underneath the second conductive semiconductor layer, and
   wherein the second contact portion is disposed on the channel layer.

4. The light emitting device of claim 1, wherein the first contact portion is provided through the first conductive semiconductor layer, the active layer, the second conductive semiconductor layer, and the first insulating layer.

5. The light emitting device of claim 1, wherein a bottom surface of the first electrode is located lower than a bottom surface of the second electrode.

6. The light emitting device of claim 1, wherein the second electrode comprises an ohmic contact layer and a reflective layer.

7. The light emitting device of claim 1, wherein the first insulating layer is disposed between the second conductive semiconductor layer and the first electrode.

8. The light emitting device of claim 1, further comprising a second insulating layer between the first electrode and the second electrode.

9. The light emitting device of claim 1, further comprising a channel layer provided around a region underneath the light emitting structure.

10. The light emitting device of claim 9, wherein the channel layer comprises an insulating material.

11. The light emitting device of claim 1, wherein the first contact portion comprises a plurality of contact portions.

12. The light emitting device of claim 11, wherein the plurality of contact portions are spaced apart from each other on the top surface of the first conductive semiconductor layer.

13. The light emitting device of claim 1, wherein the first contact portion has a width in a range of about 5 µm to about 200 µm.

14. The light emitting device of claim 1, wherein the first electrode comprises a metal layer and a conductive support member provided under the metal layer.

15. A light emitting device comprising:
   a light emitting structure including a first conductive semiconductor layer, an active layer provided under the first conductive semiconductor layer, and a second conductive semiconductor layer provided under the active layer;
   a first electrode provided under the light emitting structure and electrically connected to the first conductive semiconductor layer;
   a second electrode provided under the light emitting structure and electrically connected to the second conductive semiconductor layer;
   a first contact portion provided through the light emitting structure and including a first region electrically connected to the first electrode and a second region contacting a top surface of the first conductive semiconductor layer; and
   a first insulating layer provided around and spaced apart from the first contact portion,
   wherein the first insulating layer is provided through the second conductive semiconductor layer and the active layer,
   wherein a through hole is provided from the top surface of the first conductive semiconductor layer to a bottom surface of the first insulating layer, and
   wherein a side surface of the first contact portion contacts a side surface of the active layer in the through hole.

16. The light emitting device of claim 15, further comprising a second contact portion spaced apart from the light emitting structure and electrically connected to the second electrode.

17. The light emitting device of claim 15, wherein the first contact portion is provided through the first conductive semiconductor layer, the active layer, and the second conductive semiconductor layer.

18. The light emitting device of claim 15, wherein a bottom surface of the first electrode is located lower than a bottom surface of the second electrode.

19. A light emitting device comprising:
a light emitting structure including a first conductive semiconductor layer, an active layer provided under the first conductive semiconductor layer, and a second conductive semiconductor layer provided under the active layer;
a first electrode provided under the light emitting structure and electrically connected to the first conductive semiconductor layer;
a second electrode provided under the light emitting structure and electrically connected to the second conductive semiconductor layer;
a plurality of first contact portions provided through the light emitting structure and including a first region electrically connected to the first electrode and a second region contacting a top surface of the first conductive semiconductor layer;
a channel layer disposed around a region underneath the second conductive semiconductor layer; and
a second contact portion spaced apart from the light emitting structure and electrically connected to the second electrode, the second contact portion disposed on the channel layer,
wherein the plurality of first contact portions are spaced apart from each other on the top surface of the first conductive semiconductor layer,
wherein a top surface of the first contact portion is located higher than a top surface of the second contact portion, and
wherein the top surface of the second contact portion is located higher than a bottom surface of the second conductive semiconductor layer.

20. The light emitting device of claim 19, wherein each first contact portion of the plurality of the first contact portions has a width in a range of about 5 μm to about 200 μm.

* * * * *